(12) United States Patent
Nam et al.

(10) Patent No.: US 7,633,337 B2
(45) Date of Patent: Dec. 15, 2009

(54) FEEDBACK-TYPE VARIABLE GAIN AMPLIFIER AND METHOD OF CONTROLLING THE SAME

(75) Inventors: Il-Ku Nam, Anyang-si (KR); Young-Jin Kim, Yongin-si (KR); Hyun-Won Mun, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 67 days.

(21) Appl. No.: 11/753,739

(22) Filed: May 25, 2007

(65) Prior Publication Data

US 2008/0055005 A1 Mar. 6, 2008

(30) Foreign Application Priority Data

May 25, 2006 (KR) .................. 10-2006-0046892

(51) Int. Cl.
*H03F 1/36* (2006.01)
(52) U.S. Cl. .................. 330/86; 330/254; 330/278; 330/260
(58) Field of Classification Search .................. 330/86, 330/254, 260, 277, 278, 282, 311
See application file for complete search history.

(56) References Cited

U.S. PATENT DOCUMENTS 6,285,257 B1 9/2001 Abe et al.
6,882,226 B2 * 4/2005 Cho et al. .................. 330/282
7,268,628 B2 * 9/2007 Noda .......................... 330/86
2007/0024377 A1 * 2/2007 Wang et al. ................. 330/305

FOREIGN PATENT DOCUMENTS

| JP | 10-219502 | 6/1999 |
| JP | 11-214932 | 8/1999 |
| JP | 2004-159195 | 6/2004 |
| KR | 1020030089067 A | 11/2003 |

OTHER PUBLICATIONS

Aly Ismail and Asad A. Abidi, "A 3-10-GHz Low-Noise Amplifier With Wideband LC-Ladder Matching Network" IEEE Journal of Solid-State Circuits, vol. 39, No. 12, Dec. 2004.

* cited by examiner

*Primary Examiner*—Khanh V Nguyen
(74) *Attorney, Agent, or Firm*—F. Chau & Assoc., LLC (57) ABSTRACT

A feedback-type variable gain amplifier including a first field effect transistor, a feedback circuit, and a load circuit. The first field effect transistor receives an input voltage signal through an input node, amplifies the input voltage signal, and outputs the amplified input voltage signal through an output node. The feedback circuit is coupled between the input node and the output node, and generates feedback impedance that is changed in response to a control signal. The load circuit is coupled between the output node and a voltage source, and generates load impedance that is changed in response to the control signal to cancel a change of input impedance due to a change of the feedback impedance. Therefore, since the input impedance is not changed when the gain of the amplifier is changed, a voltage standing wave ratio is good, and a range of gain control is broad.

27 Claims, 8 Drawing Sheets

FEEDBACK-TYPE VARIABLE GAIN AMPLIFIER AND METHOD OF CONTROLLING THE SAME

CROSS-REFERENCE TO RELATED APPLICATION

This application claims priority under 35 USC § 119 to Korean Patent Application No. 10-2006-0046892, filed on May 25, 2006 in the Korean Intellectual Property Office (KIPO) the disclosure of which is incorporated herein in its entirety by reference.

BACKGROUND OF THE INVENTION

1. Technical Field

The present disclosure relates to a variable gain amplifier and more particularly, to a feedback-type variable gain amplifier including a feedback circuit.

2. Discussion of Related Art

A variable gain amplifier is an amplifier that can have its gain controlled. A feedback-type variable gain amplifier is an amplifier that can have its gain controlled by an impedance of a feedback circuit.

A feedback-type variable gain amplifier is disclosed in U.S. Pat. No. 6,285,257 and Korean Patent No. 2003-0089067. An operation of a feedback-type variable gain amplifier is described in "A 3-10-GHz low-noise amplifier with wideband LC-ladder matching network" Aly Ismail et al. IEEE Journal of Solid-state Circuits, VOL. 39, NO. 12, December 2004.

Referring to the journal article, an input impedance of an amplifier is expressed as Formula 1 below, in which ZFB denotes an impedance of a feedback circuit, ZL denotes at impedance of a load circuit, and gm denotes a trans-conductance of a transistor.

$$Zi = \frac{ZFB + ZL}{1 + gm \cdot ZL} \quad \text{[Formula 1]}$$

According to Formula 1, if the feedback impedance ZFB is changed in order to control a gain of the amplifier the input impedance of the amplifier is also changed.

If the input impedance of the amplifier is changed, an impedance match with other circuit blocks coupled to the amplifier may be broken. In addition, if the input impedance of the amplifier is changed, a reflection ratio of an import signal is also changed.

A voltage gain AV of an amplifier is expressed as Formula 2.

$$AV = \frac{VO}{VIN} = \frac{-(gm - 1/ZFB)}{(1/ZFB + 1/ZL)} \quad \text{[Formula 2]}$$

According to Formula 2, the voltage gain AV of the amplifier may be controlled by using the impedance ZFB of the feedback circuit and the impedance ZL of the load circuit.

A voltage standing wave ratio (VSWR) is used to indicate a reflection amount of a signal at an input terminal in a circuit. If a reflection coefficient is denoted as Γ, the VSWR is expressed as Formula 3.

$$VSWR = \frac{1 + |\Gamma|}{1 - |\Gamma|} \quad \text{[Formula 3]}$$

If the input impedance of the amplifier is changed, the reflection coefficient is changed. In addition, if the reflection coefficient is changed, the VSWR is also changed.

Therefore a feedback-type variable gain amplifier that can control a gain of an amplifier without changing the amplifier input impedance is required.

SUMMARY OF THE INVENTION

Accordingly, exemplary embodiments of the present invention are provided to substantially obviate one or more problems due to limitations and disadvantages of the prior art.

Some exemplary embodiments of the present invention provide a feedback-type variable gain amplifier having features in which a gain can be changed without changes of an input impedance and a voltage standing wave ratio (VSWR).

Exemplary embodiments of the present invention provide a feedback-type variable gain amplifier having features in which a range of gain control is broad.

Some exemplary embodiments of the present invention provide a method of controlling a feedback-type variable gain amplifier having features in which a gain can be changed without changing an input impedance or a VSWR, and in which a range of gain control is broad.

In some exemplary embodiments of the present invention, a feedback-type variable gain amplifier includes a first field effect transistor, a feedback circuit, and a load circuit.

The first field effect transistor, receives an input voltage signal through an input node, amplifies the input voltage signal, and outputs the amplified input voltage signal through an output node. The feedback circuit is coupled between the input node and the output node, and generates a feedback impedance that is changed in response to a control signal. The load circuit is coupled between the output node and a first voltage source, and generates a load impedance that is changed in response to the control signal to cancel a change of an input impedance due to a change of the feedback impedance.

In some exemplary embodiments of the present invention a feedback-type variable gain amplifier includes a first field effect transistor, a first feedback circuit, a first load circuit, a second field effect transistor, a second feedback circuit, and a second load circuit.

The first field effect transistor receives a first input voltage signal through a first input node, amplifies the first input voltage signals and outputs the amplified first input voltage signal through a first output node. The first feedback circuit is coupled between the first input node and the first output node and generates a first feedback impedance that is changed in response to a first control signal. The first load circuit is coupled between the first output node and a voltage source, and generates a first load impedance that is changed in response to the first control signal to cancel a change of an input impedance due to a change of the first feedback impedance. The second field effect transistor receives a second input voltage signal that is a differential pair with the first input voltage signal through a second input node, amplifies the second input voltage signal, and outputs the amplified second input, voltage to a second output node. The second feedback circuit is coupled between the second input node and the second output node, and generates a second feedback impedance that is changed in response to a second control signal. The second load circuit is coupled between the second output node and the voltage source, and generates a second load impedance that is changed in response to the second control signal to cancel a change of the input impedance due to a change of the second feedback impedance.

In exemplary embodiments of the present invention, a feedback-type variable gain amplifier includes a first field effect transistor, a second field effect transistor, a feedback circuit, and a load circuit.

The first field effect transistor receives an input voltage signal through an input node, and amplifies the input voltage signal. The second field effect transistor is coupled between a first output terminal of the first field effect transistor and an output node, and has a control terminal for receiving a bias voltage. The feedback circuit is coupled between the input node and the output node, and generates a feedback impedance that is changed in response to a control signal. The load circuit is coupled between the output node and a first voltage source and generates a load impedance that is changed in response to the control signal to cancel a change of an input impedance due to a change of the feedback impedance.

In accordance with exemplary embodiments of the present invention a feedback-type variable gain amplifier includes a first field effect transistor, a second field effect transistor, a first feedback circuit, a first load circuit, a third field effect transistor a fourth field effect transistor, a second feedback circuit, and a second load circuit.

The first field effect transistor receives a first input voltage signal through a first input node, and amplifies the first input voltage signal. The second field effect transistor is coupled between a first output terminal of the first field effect transistor and a first output node, and has a control terminal for receiving a first bias voltage. The first feedback circuit is coupled between the first input node and the first output node, and generates a first feedback impedance that is changed is response to a first control signal. The first load circuit is coupled between the first output node and a voltage source, and generates a first load impedance that is changed in response to the first control signal to cancel a change of an input impedance due to a change of the first feedback impedance. The third field effect transistor receives a second input voltage signal that is a differential pair with the first input voltage signal through a second input node, and amplifies the second input voltage signal. The fourth field effect transistor is coupled between a first output terminal of the third field effect transistor and a second output node, and has a control terminal for receiving a second bias voltage. The second feedback circuit is coupled between the second input node and the second output node, and generates a second feedback impedance that is changed in response to a second control signal. The second load circuit is coupled between the second output node and the voltage source, and generates a second load impedance that is changed in response to the second control signal to cancel a change of the input impedance due to a change of the second feedback impedance.

In exemplary embodiments of the present invention, a method of controlling a feedback-type variable gain amplifier includes receiving an input voltage signal, changing a feedback impedance in response to a control signal, changing a load impedance in response to the control signal to cancel a change of an input impedance due to a change of the feedback impedance, and amplifying the input voltage signal based on the feedback impedance and the load impedance.

Accordingly, the feedback-type variable gain amplifier according to exemplary embodiments of the present invention may have its gain changed without changing an input impedance, may have a good voltage standing wave ratio (VSWR), and may have a broad range of gain control.

BRIEF DESCRIPTION OF THE DRAWINGS

Exemplary embodiments of the present invention will be understood in more detail from the following in descriptions taken in conjunction with the accompanying drawings.

DESCRIPTION OF EXEMPLARY EMBODIMENTS

Exemplary embodiments of the present invention will be described more fully with reference to the accompanying drawings, in which the exemplary embodiments of the present invention are shown. This invention may, however, be embodied in many different forms and should not be construed as limited to the exemplary embodiments set forth herein. Rather, these exemplary embodiments are provided so that this disclosure will be thorough and complete, and will fully convey the scope of the invention to those skilled in the art. Like reference numerals refer to like elements throughout this application.

Figure 1:
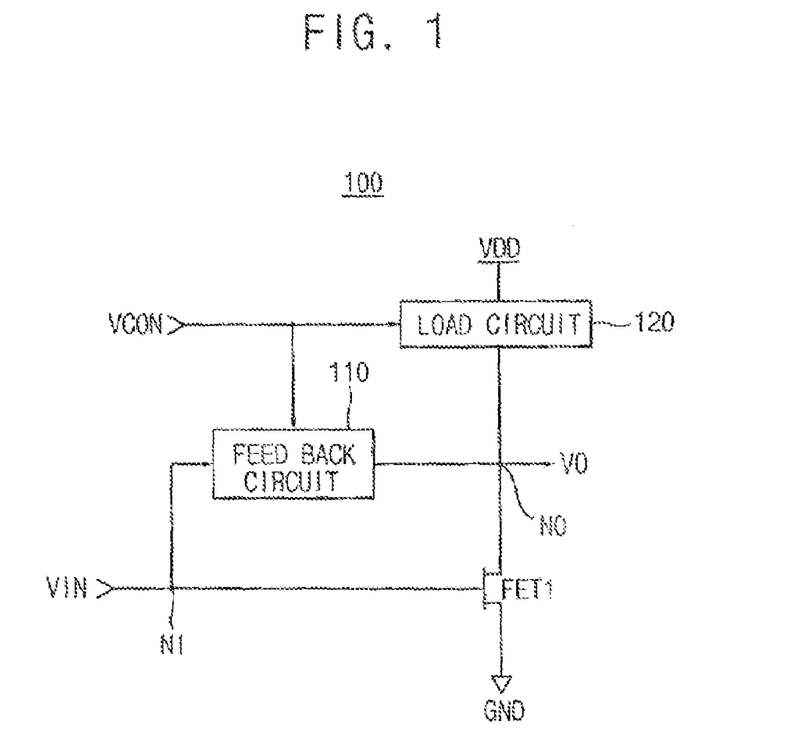
FIG. 1 is a circuit diagram illustrating a feedback-type variable gain amplifier according to an exemplary embodiment of the present invention.

FIG. 1 is a circuit diagram illustrating a feedback-type variable gain amplifier 100 according to an exemplary embodiment of the present invention.

Referring to FIG. 1, the feedback-type variable gain amplifier 100 includes a field effect transistor FET1, a feedback circuit 110, and a load circuit 120.

The field effect transistor FET1 receives an input voltage signal VIN through an input node NI, amplifies the input voltage signal VIN, and outputs the amplified input voltage signal VIN as output voltage signal VO through an output node NO. The feedback circuit 110 is coupled between the input node NI and the output node NO, and generates a feedback impedance that is changed in response to a control signal VCON. The load circuit 120 is coupled between the output node NO and a voltage source VDD, and generates a load impedance that is changed in response to the control signal VCON.

The first field effect transistor FET1 is different from a bipolar junction transistor. In a field effect transistor, a channel is formed between a drain region and a source region in response to a voltage applied to a gate electrode. A metal-oxide semiconductor field effect transistor (MOSFET) may be used as the field effect transistor FET1.

Hereinafter, an operation of the feedback-type variable gain amplifier 100 will be described.

In a conventional feedback-type variable gain amplifier, if a feedback impedance is changed for controlling a gain of the amplifier, an input impedance of the feedback-type variable gain amplifier is changed. If the input impedance of the feedback-type variable gain amplifier is changed an impedance matching may be broken between the feedback-type variable gain amplifier, and other circuit blocks coupled to the feedback-type variable gain amplifier. In addition, a voltage standing wave ratio (VSWR) may be changed since a reflection ratio of signals is changed due to the change to the input impedance.

The feedback-type variable gain amplifier 100 of FIG. 1 changes an impedance of the feedback circuit 110 by using the control signal VCON in order to control the gain, and changes an impedance of the load circuit 120 by using the control signal VCON. The feedback-type variable gain amplifier 100 changes a voltage gain by changing the impedance of the feedback circuit 110 and the impedance of the load circuit 120, amplifies the input voltage signal VIN by the changed voltage gain, and generates an output voltage signal VO.

The feedback-type variable gain amplifier 100 of FIG. 1 may prevent a change of an input impedance Zi by controlling a feedback impedance ZFB and a load impedance ZL as expressed in Formula 1. Rearranging Formula 1, the load impedance ZL may be expressed as Formula 4, $$ZL = \frac{ZFB - Zi}{gm \cdot Zi - 1} \quad \text{[Formula 4]}$$

In Formula 4, the trans-conductance gm is decided by a size of the field effect transistor FET1 and a drain/source current of the field effect transistor FET1. The input impedance Zi may be changed depending on the system. If the load impedance ZL is controlled by using the control signal VCON in order to satisfy Formula 4, the input impedance Zi can not be changed. Therefore, since the input impedance Zi is not changed regardless of the change of the feedback impedance ZFB, the VSWR can not be changed.

In order to control a gain AV of the amplifier, the impedance ZFB of the feedback circuit 110 is controlled by the control signal VCON. The impedance ZL of the load circuit 120 is changed based on Formula 4. Referring to Formula 2, the gain AV of the amplifier is decided by changes of the impedance ZFB of the feedback circuit 10 and the impedance ZL of the load circuit 120.

Figure 2:
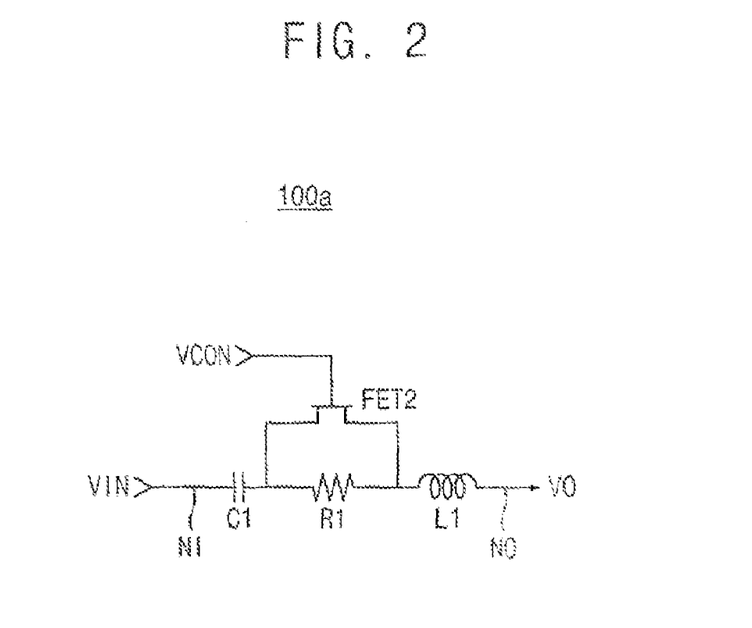
FIG. 2 is a circuit diagram illustrating an example of a feedback circuit in the feedback-type variable gain amplifier of FIG. 1.

FIG. 2 is a circuit diagram illustrating an exemplary embodiment of a feedback circuit in the feedback-type variable gain amplifier of FIG. 1.

Referring to FIG. 2, the feedback circuit 110a includes a capacitor C1, a resistor R1, and an inductor L1 that are coupled in series between an input node NI and an output node NO. The feedback circuit 110a also includes a field effect transistor FET2 that is coupled in parallel to the resistor R1 and connected to both ends of the resistor R1. The field effect transistor FET2 operates in response to the control signal VCON.

An on-resistance of the field effect transistor FET2 may be changed in response to the control signal VCON. If the on-resistance of the field effect transistor FET2 is changed, an impedance between trio input node NI and the output node NO is changed. Therefore, the voltage gain of the feedback-type variable gain amplifier 100 of FIG. 1 is controlled. The field effect transistor FET2 is turned on or turned off in response to the control signal VCON. If the field effect transistor FET2 is turned on, the resistor R1 in the feedback circuit 110a become electrically shorted. If the field effect transistor FET2 is turned off, an original resistance of the resistor R1 is effective. The capacitor C1 and the inductor L1 are included in the feedback circuit 110a, and an impedance of the capacitor C1 is decreased if a frequency of an applied signal is increased and an impedance of the inductor L1 is increased if the frequency of the applied signal is increased.

Figure 3:
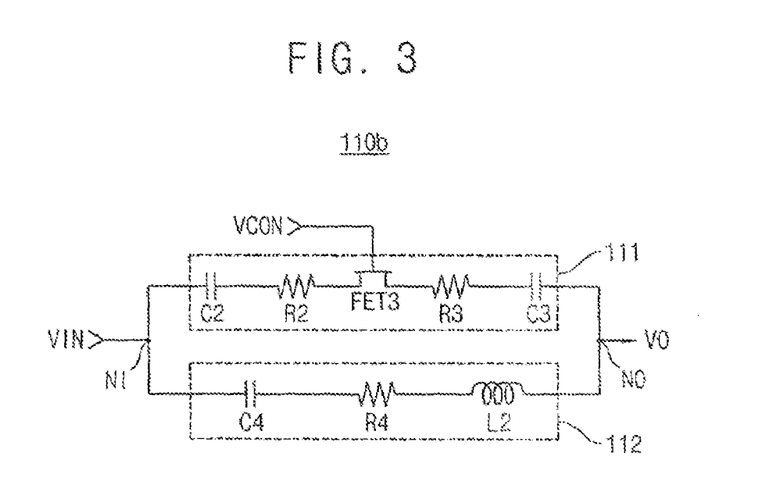
FIG. 3 is a circuit diagram illustrating another example of a feedback circuit in the feedback-type variable gain amplifier of FIG. 1.

FIG. 3 is a circuit diagram illustrating an exemplary embodiment of a feedback circuit used in the feedback-type variable gain amplifier of FIG. 1.

Referring to FIG. 3, the feedback circuit 110b includes a first circuit 112 of a capacitor C4, a resistor R4, and an inductor L2 that are coupled in series between an input node NI and an output node NO. The feedback circuit 110b also includes a second circuit 111 of a capacitor C2, a resistor R2, a field effect transistor FET3, a resistor R3, and a capacitor C3 that are coupled in series between the input node NI and the output node NO.

The first circuit 112 of the capacitor C4, the resistor R4, and the inductor L2 that are coupled in series between the input node NI and the output node NO improves the frequency characteristics of the feedback-type variable gain amplifier 100. The second circuit 111 of the capacitor C2, the resistor R2, the field effect transistor FET3, the resistor R3, and the capacitor C3 that are coupled in series between the input node NI and the output node NO controls a voltage gain of the feedback-type variable gain amplifier 100. The field effect transistor FET2 is turned on or turned off in response to the control signal VCON. An on-resistance of the field effect transistor FET2 is changed in response to the control signal VCON.

Figure 4:
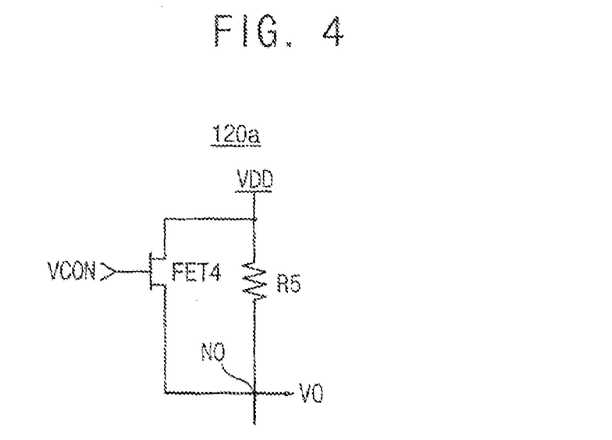
FIG. 4 is a circuit diagram illustrating an example of a load circuit in the feedback-type variable gain amplifier of FIG. 1.

FIG. 4 is a circuit diagram illustrating an exemplary embodiment of a load circuit in the feedback-type variable gain amplifier of FIG. 1.

Referring to FIG. 4, the load circuit 120a includes a resistor R5 that is coupled between a voltage source VDD and an output node NO. The load circuit 120a also includes a field effect transistor FET4 that is coupled in parallel to the resistor R5 between both ends of the resistor R5 and operates in response to a control signal VCON fed thereto.

An on-resistance of the field effect transistor FET4 is changed in response to the control signal VCON. If the on-resistance of the field effect transistor FET4 is changed, an impedance between the voltage source VDD and the output node NO is changed. Therefore, the voltage gain of the feedback-type variable gain amplifier 100 is controlled. The field effect transistor FET4 is turned on or turned off in response to the control signal VCON. If the field effect transistor FET4 is turned on, a load impedance is decided by estimating a parallel-coupling resistance between the resistor R5 in the feedback circuit 120a and the on-resistance of the field effect transistor FET4. If the field effect transistor FET4 is turned off, the original resistance of the resistor R5 in the feedback circuit 120a is effective.

Figure 5:
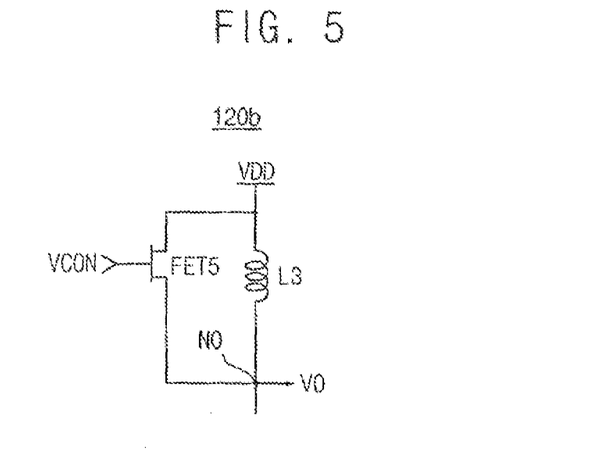
FIG. 5 is a circuit diagram illustrating another example of a load circuit in the feedback-type variable gain amplifier of FIG. 1.

FIG. 5 is a circuit diagram illustrating an exemplary embodiment of a load circuit in the feedback-type variable gain amplifier of FIG. 1.

Referring to FIG. 5, the load circuit 120b includes an inductor L3 that is coupled between a voltage source VDD and an output node NO. The load circuit 120b also includes a field effect transistor FET5 that is coupled in parallel to the inductor L3 between both ends of the inductor L3 and operates in response to a control signal VCON fed thereto.

The load circuit 120b includes the inductor L3 instead of a resistor. An on-resistance of the field effect transistor FET5 is changed in response to the control signal VCON. If the on-resistance of the field effect transistor FET5 is changed, an impedance between the voltage source VDD and the output node NO is changed. Therefore, the voltage gain of the feedback-type variable gain amplifier 100 is controlled. The field effect transistor FET5 is turned on or turned off in response to the control signal VCON. If the field effect transistor FET5 is turned on, the load impedance is decided by estimating a parallel-coupling impedance between an impedance of the inductor L3 in the load circuit 120b and an on-resistance of the field effect transistor FET5. If the field effect transistor FET5 is turned off, the original impedance of the inductor L3 in the load circuit 120b is effective.

In a method of controlling a feedback-type variable gain amplifier according to exemplary embodiments of the present invention, an input voltage signal is received, and a feedback impedance is changed in response to a control signal. In addition, a load impedance is changed in response to the control signal, and the input voltage signal is amplified based on the feedback impedance and the load impedance.

Figure 6:
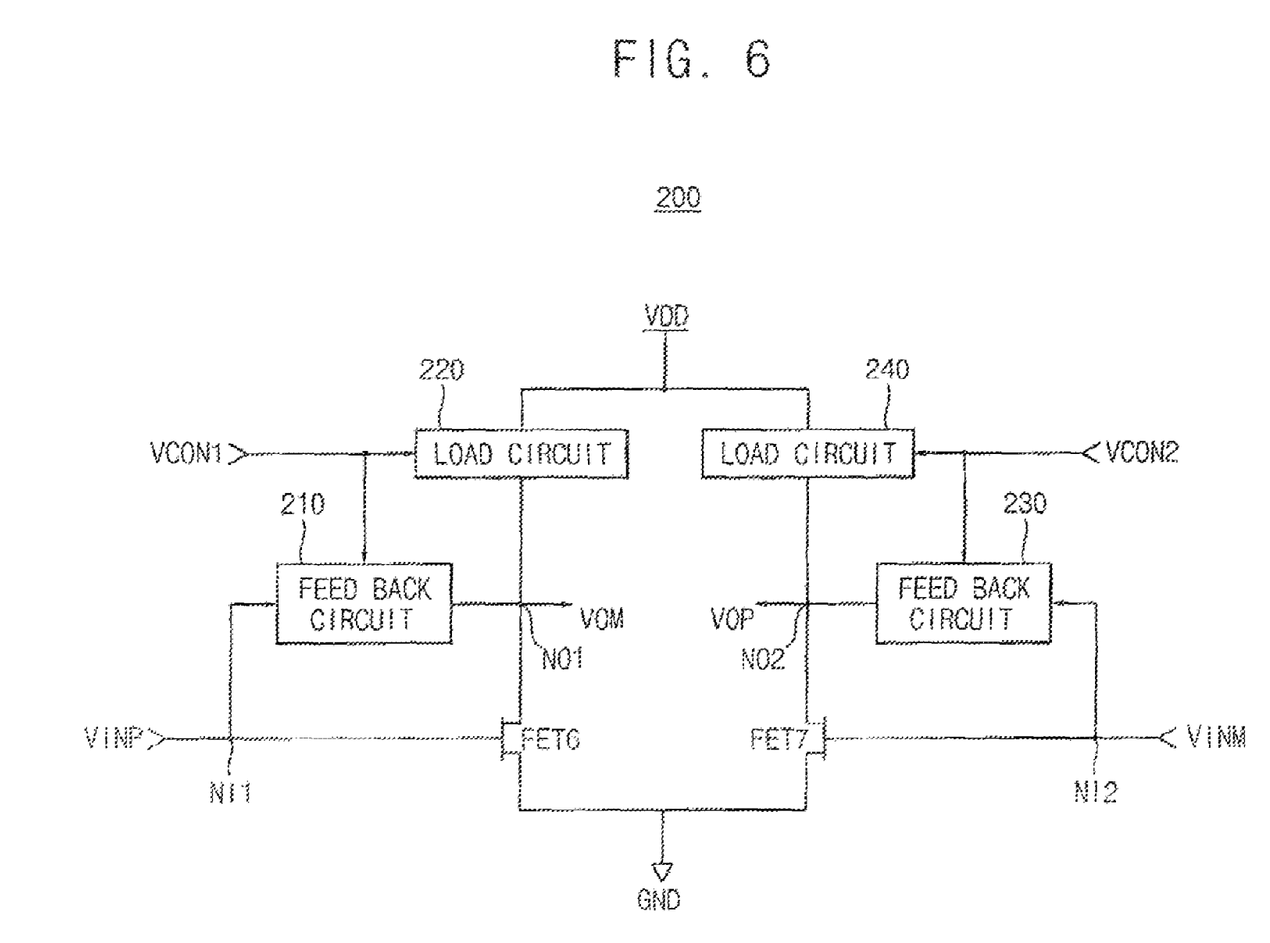
FIG. 6 is a circuit diagram illustrating a feedback-type variable gain amplifier according to an exemplary embodiment of the present invention.

FIG. 6 is a circuit diagram illustrating a feedback-type variable gain amplifier according to an exemplary embodiment of the present invention.

Referring to FIG. 6, the feedback-type variable gain amplifier 200 includes field effect transistors FET6, FET7, feedback circuits 210, 230, and load circuits 220, 240.

The field effect transistor FET6 receives an input voltage signal VINP through a first input node NI1, amplifies the input voltage signal VINP, and outputs the amplified voltage signal VOM through a first output node NO1. The first feedback circuit 210 is coupled between the first input node NI1 and the first output node NO1, and generates a feedback impedance that is changed in response to a control signal VCON1 fed thereto. The first load circuit 220 is coupled between the first output node NO1 and a voltage source VDD, and generates a load impedance that is changed in response to the first control signal VCON1. The field effect transistor FET7 receives an input voltage signal VINM through an input node NI2, amplifies the input voltage signal VINM, and outputs the amplified voltage signal VOP through a second output node NO2. The second feedback circuit 230 is coupled between the second input node NI2 and the second output node NO2, and generates a feedback impedance that is changed in response to a second control signal VCON2. The second load circuit 240 is coupled between the second output node NO2 and a voltage source VDD, and generates a load impedance that is changed in response to the second control signal VCON2.

In the feedback-type variable gain amplifier 200, the first control signal VCON1 may be identical to the second control signal VCON2.

Hereinafter, an operation of the feedback-type variable gain amplifier 200 will be described.

The feedback-type variable gain amplifier 200 amplifies differential input voltage signals VINP, VINM, and generates differential output voltage signals VOM, VOP.

The feedback-type variable gain amplifier 200 changes an impedance of the feedback circuits 210, 230 by using the control signals VCON1, VCON2 in order to control a gain. The feedback-type variable gain amplifier 200 also changes an impedance of the load circuits 220, 240 by using the control signals VCON1, VCON2. The feedback-type variable gain amplifier 200 changes the gain by changing an impedance of the feedback circuits 210, 230 and an impedance of the load circuits 220, 240, amplifies the input voltage signals VINP, VINM by the changed gain, and generates the output voltage signals VOM, VOP.

In Formula 1, the feedback-type variable gain amplifier 200 prevents a change of an input impedance Zi by controlling a feedback impedance ZFB and a load impedance ZL. The load impedance ZL may be controlled according to Formula 4.

By controlling the load impedance ZL in response to the control signal VCON, the feedback-type variable gain amplifier 200 prevents a change of a VSWR when the gain is changed.

Figure 7:
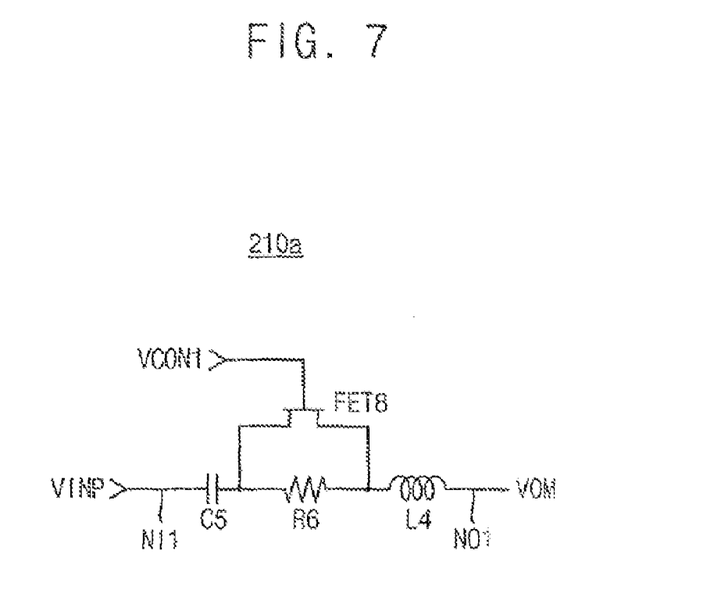
FIG. 7 is a circuit diagram illustrating an example of a first feedback circuit in the feedback-type variable gain amplifier of FIG. 6.

FIG. 7 is a circuit diagram illustrating an exemplary embodiment of a first feedback circuit in the feedback-type variable gain amplifier of FIG. 6.

Referring to FIG. 7, the first feedback circuit 210a includes a capacitor C5, a resistor R6, and an inductor L4 that are coupled in series between an input node NI1 and an output node NO1. The first feedback circuit 210a also includes a field effect transistor FET8 that is coupled in parallel to the resistor R6 between both ends of the resistor R6 and that operates in response to a control signal VCON1 fed thereto.

The first feedback circuit 210a of FIG. 7 operates the same as the feedback circuit 110a of FIG. 2.

Figure 8:
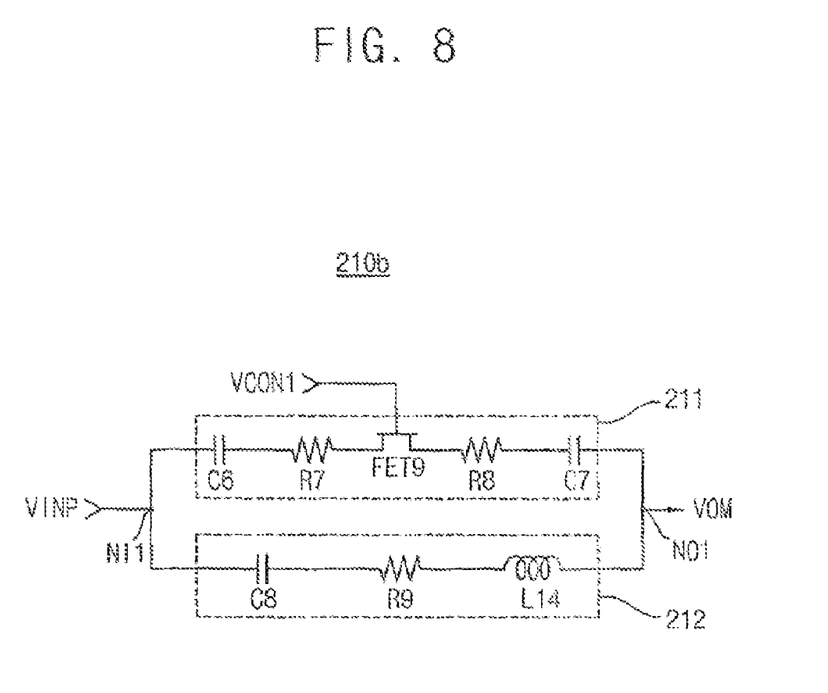
FIG. 8 is a circuit diagram illustrating another example of a first feedback circuit in the feedback-type variable gain amplifier of FIG. 6.

FIG. 8 is a circuit diagram illustrating an exemplary embodiment of a first feedback circuit in the feedback-type variable gain amplifier of FIG. 6.

Referring to FIG. 8, the first feedback circuit 210b includes a first circuit 212 formed of a capacitor C8, a resistor R9, and an inductor L14 that are coupled in series between an input node NI1 and an output node NO1. The first feedback circuit 210b also includes a second circuit 211 formed of a capacitor C6, a resistor R7, a field effect transistor FET9, a resistor R8, and a capacitor C7 that are coupled in series between the input node NI1 and the output node NO1. The field effect transistor FET9 operates in response to a control signal VCON1 fed thereto.

The first feedback circuit 210b of FIG. 8 operates the same as the feedback circuit 110b of FIG. 3.

Figure 9:
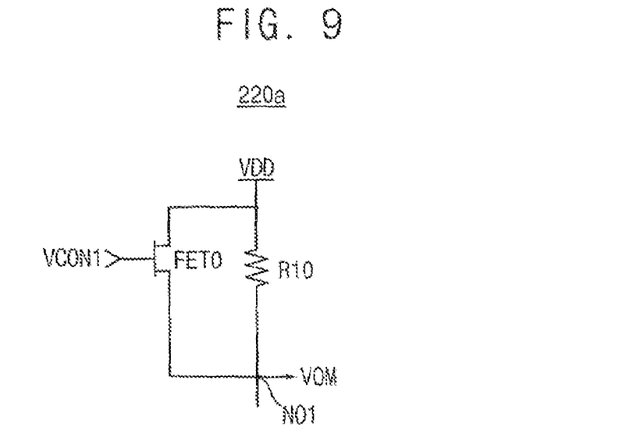
FIG. 9 is a circuit diagram illustrating an example of a first load circuit in the feedback-type variable gain amplifier of FIG. 6.

FIG. 9 is a circuit diagram illustrating an exemplary embodiment of a first load circuit in the feedback-type variable gain amplifier of FIG. 6.

Referring to FIG. 9, the first load circuit 220a includes a resistor R10 that is coupled between a voltage source VDD and an output node NO1. The first load circuit 220a also includes a field effect transistor FET10 that is coupled in parallel to the resistor R10 between both ends of the resistor R10 and operates in response to a control signal VCON1 fed thereto.

The first load circuit 220a of FIG. 9 operates the same as the load circuit 120a of FIG. 4.

Figure 10:
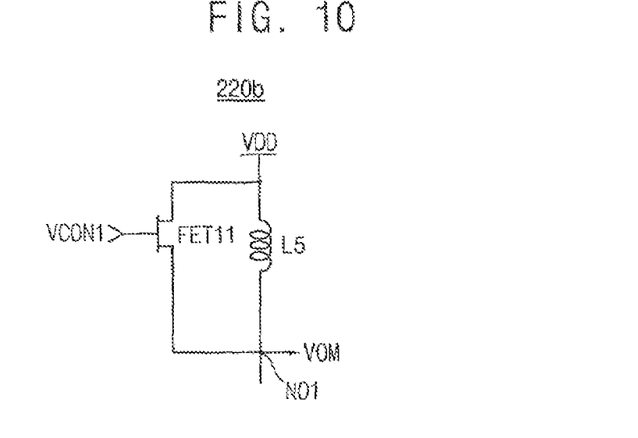
FIG. 10 is a circuit diagram illustrating another example of a first load circuit in the feedback-type variable gain amplifier of FIG. 6.

FIG. 10 is a circuit diagram illustrating an exemplary embodiment of a first load circuit in the feedback-type variable gain amplifier of FIG. 6.

Referring to FIG. 10, the first load circuit 220b includes an inductor L5 that is coupled between a voltage source VDD and an output node NO1. The first load circuit 220b also includes a field effect transistor FET11 that is coupled in parallel to the inductor L5 between both ends of the inductor L5 and that operates in response to a control signal VCON1 fed thereto.

The first load circuit 220b of FIG. 10 operates the same as the load circuit 120b of FIG. 5.

Figure 11:
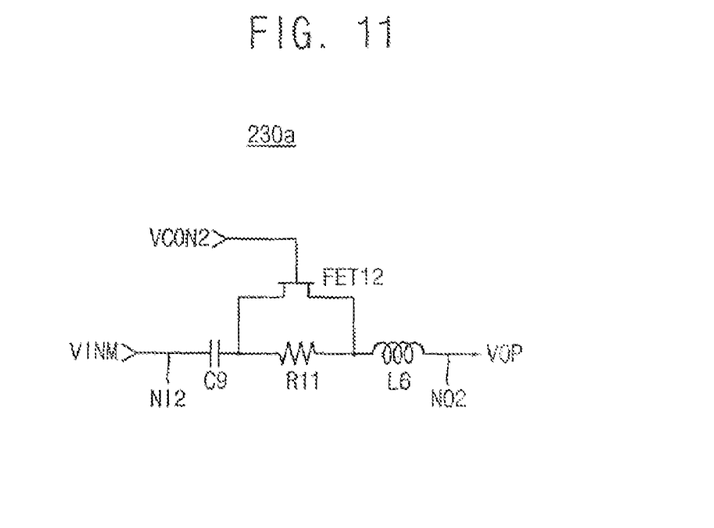
FIG. 11 is a circuit diagram illustrating an example of a second feedback circuit in the feedback-type variable gain amplifier of FIG. 6.

FIG. 11 is a circuit diagram illustrating an exemplary embodiment of a second feedback circuit in the feedback-type variable gain amplifier of FIG. 6.

Referring to FIG. 11, the second feedback circuit 230a includes a capacitor C9, a resistor R11, and an inductor L6 that are coupled in series between an input node NI2 and an output node NO2. The second feedback circuit 230a also includes a field effect transistor FET12 that is coupled in parallel to the resistor R11 between both ends of the resistor R11 and operates in response to a control signal VCON2 fed thereto.

The second feedback circuit 230a of FIG. 11 operates the same as the feedback circuit 110a of FIG. 2.

Figure 12:
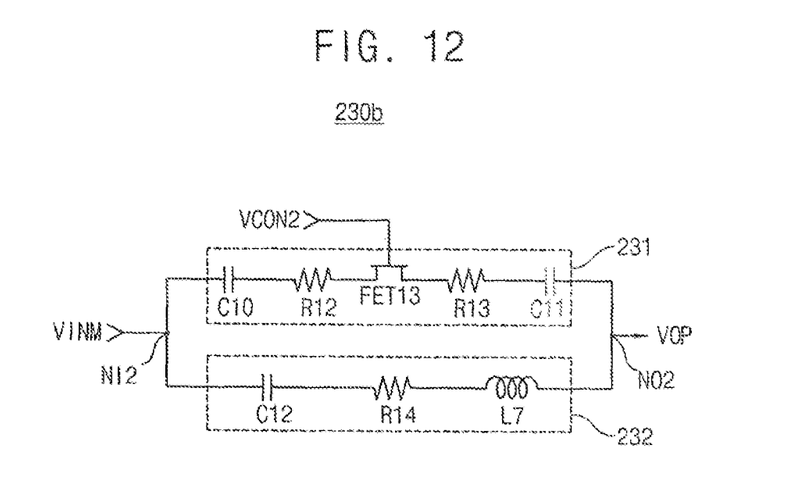
FIG. 12 is a circuit diagram illustrating another example of a second feedback circuit in the feedback-type variable gain amplifier of FIG. 6.

FIG. 12 is a circuit diagram illustrating an exemplary embodiment of a second feedback circuit in the feedback-type variable gain amplifier of FIG. 6.

Referring to FIG. 12, the feedback circuit 230b includes a first circuit 232 formed of a capacitor C12, a resistor R14, and an inductor L7 that are coupled in series between an input node NI2 and an output node NO2. The feedback circuit 230b also includes a second circuit 231 formed of a capacitor C10, a resistor R12, a field effect transistor FET13, a resistor R13, and a capacitor C11 that are coupled in series between the input node NI2 and the output node NO2. The field effect transistor FET13 operates in response to a control signal VCON2 fed thereto.

The second feedback circuit 230b of FIG. 12 operates the same as the feedback circuit 110b of FIG. 3.

Figure 13:
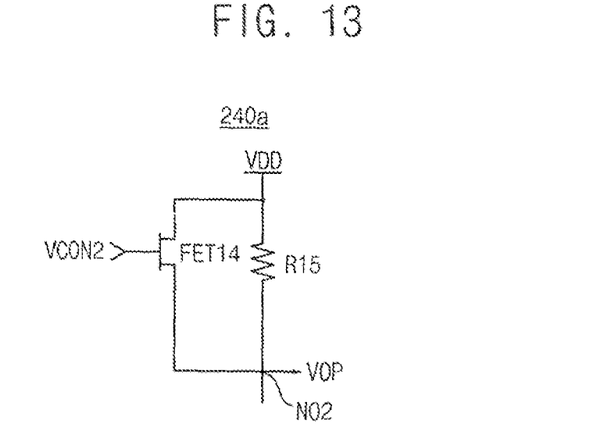
FIG. 13 is a circuit diagram illustrating an example of a second load circuit in the feedback-type variable gain amplifier of FIG. 6.

FIG. 13 is a circuit diagram illustrating an exemplary embodiment of a second load circuit in the feedback-type variable gain amplifier of FIG. 6.

Referring to FIG. 13, the second load circuit 240a includes a resistor R15 that is coupled between a voltage source VDD and an output node NO2. The second load circuit 240a also includes a field effect transistor FET14 that is coupled in parallel to the resistor R15 between both ends of the resistor R15 and operates in response to a control signal VCON2 fed thereto.

The second load circuit 240a of FIG. 13 operates the same as the load circuit 120a of FIG. 4.

Figure 14:
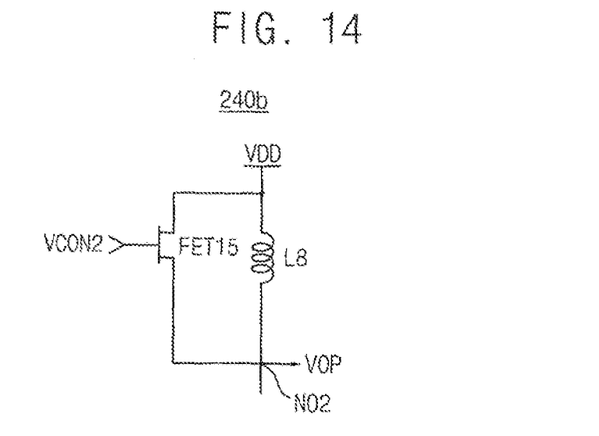
FIG. 14 is a circuit diagram illustrating another example of a second load circuit in the feedback-type variable gain amplifier of FIG. 6.

FIG. 14 is a circuit diagram illustrating an exemplary embodiment of a second load circuit in the feedback-type variable gain amplifier of FIG. 6.

Referring to FIG. 14, the second load circuit 240b includes an inductor L8 that is coupled between a voltage source VDD and an output node NO2. The second load circuit 240b also includes a field effect transistor FET15 that is coupled in parallel to the inductor L8 between both ends of the inductor L8 and operates in response to a control signal VCON2 fed thereto.

The second load circuit 240b of FIG. 14 operates the same as the load circuit 120b of FIG. 5.

Figure 15:
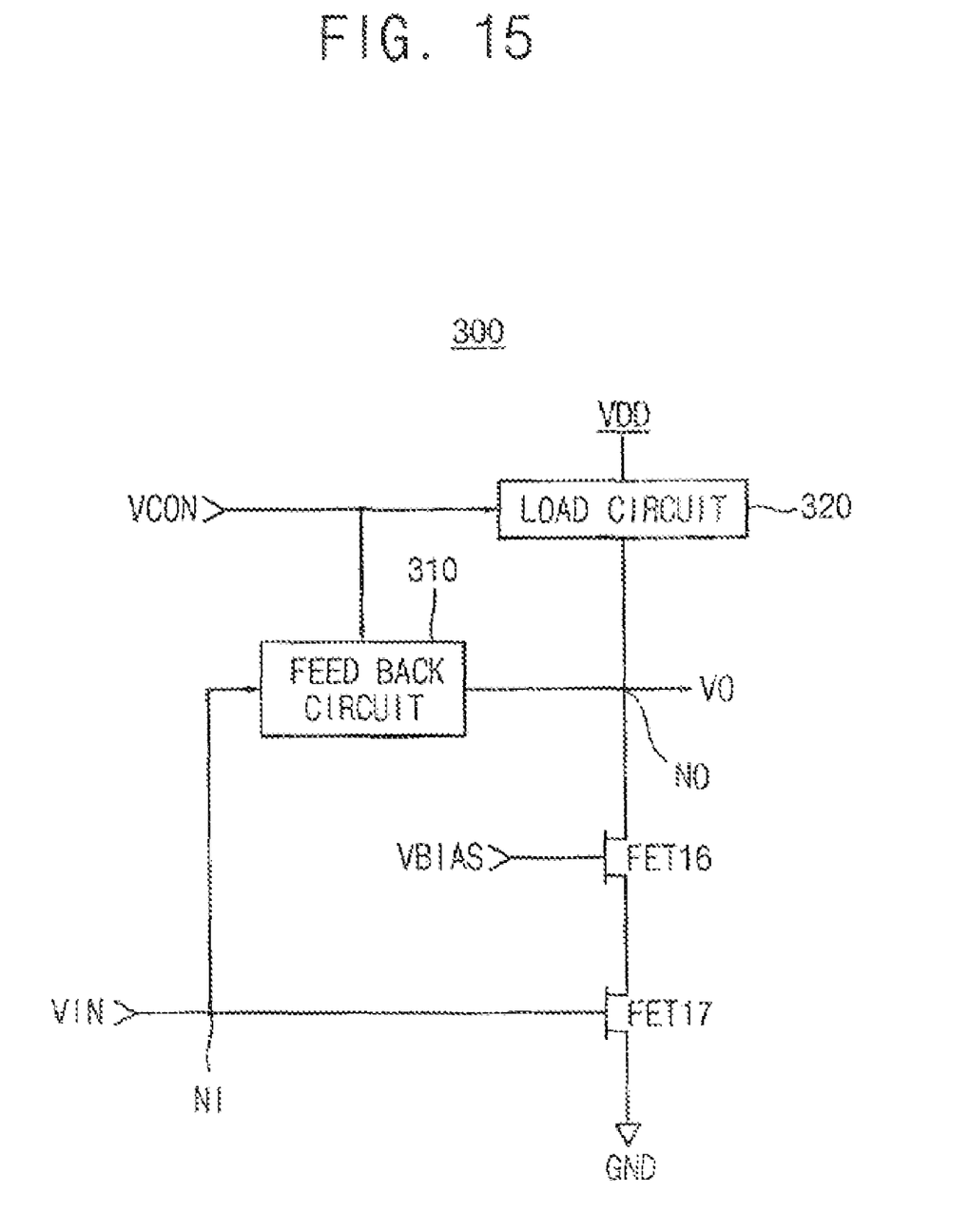
FIG. 15 is a circuit diagram illustrating a feedback-type variable gain amplifier according to an exemplary embodiment of type present invention.

FIG. 15 is a circuit diagram illustrating a feedback-type variable gain amplifier according to an exemplary embodiment of the present invention.

Referring to FIG. 15, the feedback-type variable gain amplifier 300 includes field effect transistors FET16, FET17, a feedback circuit 310, and a load circuit 320.

The field effect transistor FET17 receives an input voltage signal VIN through an input node NI, and amplifies the input voltage signal VIN. The field effect transistor FET16 is coupled between a drain terminal of the field effect transistor FET17 and an output node NO, and has a control terminal for receiving a bias voltage VBIAS. The feedback circuit 310 is coupled between the input node NI and the output node NO, and generates a feedback impedance that is changed in response to a control signal VCON. The load circuit 320 is coupled between the output node NO and a voltage source VDD, and generates a load impedance that is changed in response to the control signal VCON.

The feedback circuit 310 may have the same structure as the feedback circuit 110 in the feedback-type variable gain amplifier 100. The load circuit 320 may have the same structure as the load circuit 120 in the feedback-type variable gain amplifier 100.

Hereinafter, an operation of the feedback-type variable gain amplifier 300 will be described.

The feedback-type variable gain amplifier 300 changes an impedance of the feedback circuit 310 by using the control signal VCON in order to control a gain, and changes an impedance of the load circuit 320 by using the control signal VCON. The feedback-type variable gain amplifier 300 changes the voltage gain by changing the impedance of the feedback circuit 310 and the impedance of the load circuit 320, amplifies the input voltage signal VIN by the changed voltage gain, and generates an output voltage signal VO.

The feedback-type variable gain amplifier 300 of FIG. 15 prevents a change of an input impedance Zi by controlling a feedback impedance ZFB and a load impedance ZL. The input impedance Zi is expressed in Formula 1.

In the feedback-type variable gain amplifier 300 of FIG. 15, the field effect transistor FET16 is coupled between a drain terminal of the field effect transistor FET17 and the output node NO. The field effect transistor FET16 has a gate terminal for receiving a bias voltage VBIAS. The feedback-type variable gain amplifier 300 has a cascade structure. In addition, since the drain terminal of the field effect transistor FET17 is not coupled directly to the output node NO, the feedback-type variable gain amplifier 300 has a high output impedance, and the frequency characteristics of the feedback-type variable gain amplifier 300 are good.

Figure 16:
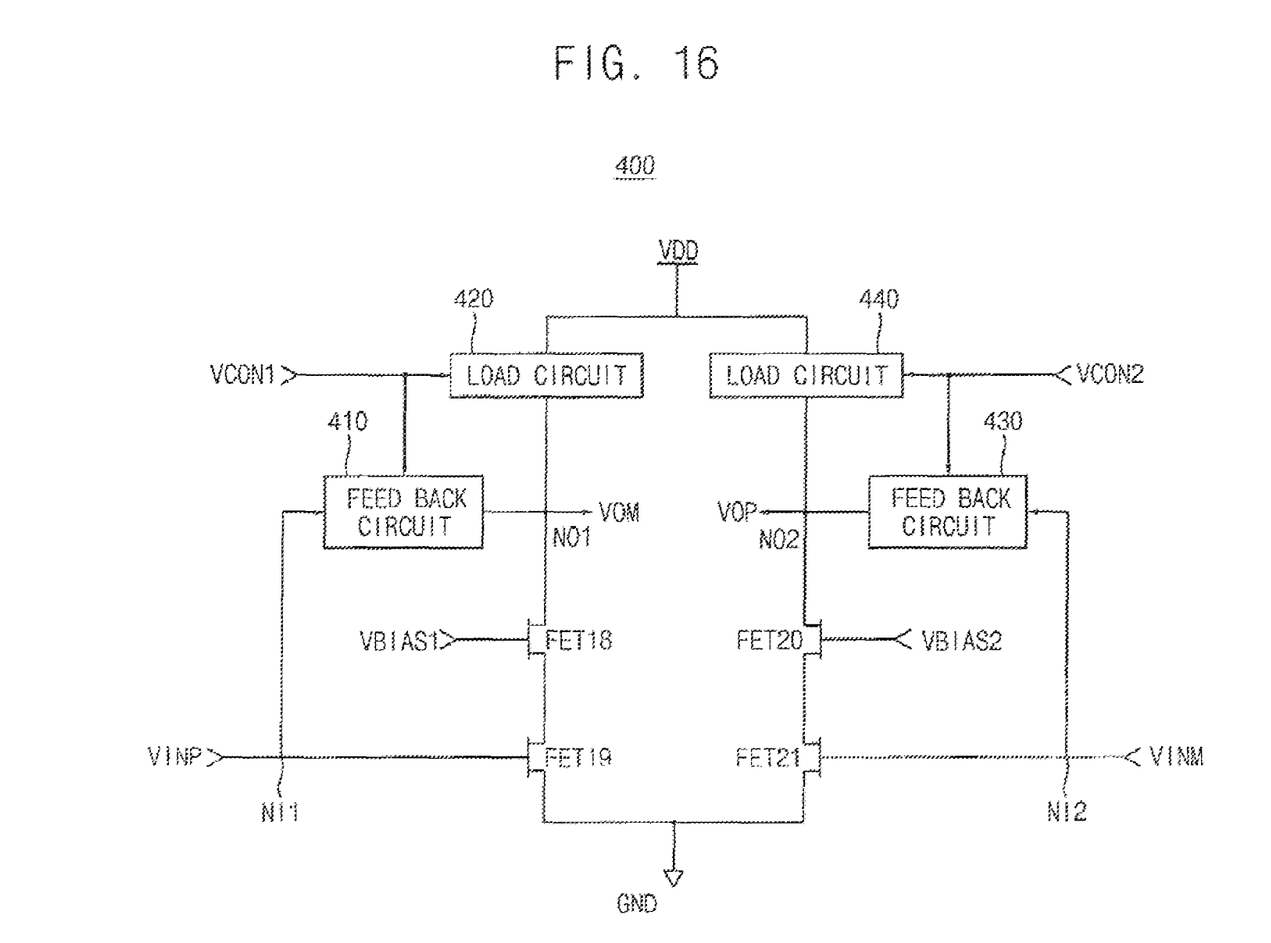
FIG. 16 is a circuit diagram illustrating a feedback-type variable gain amplifier according to an exemplary embodiment of the present invention.

FIG. 16 is a circuit diagram illustrating a feedback-type variable gain amplifier according to an exemplary embodiment of the present invention.

Referring to FIG. 16, the feedback-type variable gain amplifier 400 includes field effect transistors REF18, FET19, FET20, FET21, feedback circuits 410, 430, and load circuits 420, 440.

The field effect transistor FET19 receives an input voltage signal VINP through a first input node NI1, and amplifies the input voltage signal VINP. The field effect transistor FET18 is coupled between a drain terminal of the field effect transistor FET19 and a first output node NO1, and has a control terminal for receiving a first bias voltage VBIAS1. A first feedback circuit 410 is coupled between the first input node NI1 and the first output node NO1, and generates a feedback impedance that is changed in response to a control signal VCON1 fed thereto. A first load circuit 420 is coupled between the first output node NO1 and a voltage source VDD, and generates a load impedance that is changed in response to the control signal VCON1 also fed thereto. The field effect transistor FET21 receives an input voltage signal VINM through a second input node NI2, and amplifies the input voltage signal VINM. The field effect transistor FET20 is coupled between a drain terminal of the field effect transistor FET21 and a second output node NO2, and has a control terminal for receiving a second bias voltage VBIAS2. A second feedback circuit 430 is coupled between the second input node NI2 and the second output node NO2, and generates a feedback impedance that is changed in response to a control signal VCON2. A second load circuit 440 is coupled between the second output node NO2 and a voltage source VDD, and generates a load impedance that is changed in response to the control signal VCON2 also fed thereto.

The feedback circuits 410, 430 may have the same structure as the feedback circuit 110 in the feedback-type variable gain amplifier 100 of FIG. 1. The load circuits 420, 440 may have the same structure as the load circuit 120 in the feedback-type variable gain amplifier 100 of FIG. 1.

Hereinafter, an operation of the feedback-type variable gain amplifier 400 will be described.

The feedback-type variable gain amplifier 400 changes an impedance of the feedback circuits 410, 430 by using the control signals VCON1, VCON2 in order to control a gain, and changes an impedance of the load circuits 420, 440 by using the control signals VCON1, VCON2. The feedback-type variable gain amplifier 400 changes a voltage gain by changing the impedance of the feedback circuits 410, 430 and the impedance of the load circuits 420, 440, amplifies input voltage signals VINP, VINM by the changed voltage gain, and generates output voltage signals VOM, VOP.

The feedback-type variable gain amplifier 400 prevents a change of an input impedance Zi by controlling a feedback impedance ZFB and a load impedance ZL. The input impedance Zi is expressed in Formula 1.

In the feedback-type variable gain amplifier 400 of FIG. 16, the field effect transistor FET18 is coupled between a drain terminal of the field effect transistor FET19 and a first output node NO1. The field effect transistor FET18 has a gate terminal for receiving a first bias voltage VBIAS1. The field effect transistor FET20 is coupled between a drain terminal of the field effect transistor FET21 and a second output node NO2. The field effect transistor FET20 has a gate terminal for receiving a second bias voltage VBIAS2. The feedback-type variable gain amplifier 400 has a cascade structure. In addition, since the drain terminals of the field effect transistor FET19, FET21 are not coupled directly to the output nodes NO1, NO2 in the feedback-type variable gain amplifier 400, the feedback-type variable gain amplifier 400 has a high output impedance, and frequency characteristics of the feedback-type variable gain amplifier 400 are good.

In accordance with exemplary embodiments of the present invention, an input impedance of a feedback-type variable gain amplifier is not changed when a gain of feedback-type variable gain amplifier is changed. A voltage standing wave ratio (VSWR) of the feedback-type variable gain amplifier is good. The feedback-type variable gain amplifier has a broad range of gain control by changing an impedance of a feedback circuit and an impedance of a load circuit.

While exemplary embodiments of the present invention and their advantages have been described in detail, it should be understood that various changes, substitutions and alterations may be made herein without departing from the scope of the invention.

What is claimed is:

1. A feedback-type variable gain amplifier, comprising:
   a first field effect transistor configured to receive an input voltage signal through an input node, to amplify the input voltage signal, and to output the amplified input voltage signal through an output node;
   a feedback circuit coupled between the input node and the output node, and configured to generate a feedback impedance that is changed in response to a control signal fed thereto; and
   a load circuit coupled between the output node and a voltage source, and configured to generate a load impedance that is changed in response to the control signal to cancel a change of an input impedance of the variable gain amplifier due to a change of the feedback impedance, wherein the load impedance and the feedback impedance are changed simultaneously in response to the control signal, and
   wherein the feedback circuit includes:
   a circuit of a capacitor, a resistor, and an inductor that are coupled in series between the input node and the output node; and
   a second field effect transistor coupled in parallel to the resistor between both ends of the resistor, and configured to operate in response to the control signal.

2. The feedback-type variable gain amplifier of claim 1, wherein the load impedance is increased when the feedback impedance is increased, and the load impedance is decreased when the feedback impedance is decreased.

3. The feedback-type variable gain amplifier of claim 1, wherein an on-resistance of the second field effect transistor is changed in response to the control signal.

4. The feedback-type variable gain amplifier of claim 1, wherein the second field effect transistor is turned on or turned off in response to the control signal.

5. A feedback-type variable gain amplifier, comprising;
   a first field effect transistor configured to receive an input voltage signal through an input node, to amplify the input voltage signal, and to output the amplified input voltage signal through an output node;
   a feedback circuit coupled between the input node and the output node, and configured to generate a feedback impedance that is changed in response to a control signal fed thereto; and
   a load circuit coupled between the output node and a voltage source, and configured to generate a load impedance that is changed in response to the control signal to cancel a change of an input impedance of the variable gain amplifier due to a change of the feedback impedance,
   wherein the load impedance and the feedback impedance are changed simultaneously in response to the control signal, and
   wherein the feedback circuit includes:
   a first circuit of a first capacitor, a first resistor, and a first inductor that are coupled in series between the input node and the output node; and
   a second circuit of a second capacitor, a second resistor, a second field effect transistor, a third resistor, and a third capacitor that are coupled in series between the input node and the output node.

6. The feedback-type variable gain amplifier of claim 5, wherein an on-resistance of the second field effect transistor is changed in response to the control signal.

7. The feedback-type variable gain amplifier of claim 5, wherein the second field effect transistor is turned on or turned off in response to the control signal.

8. The feedback-type variable gain amplifier of claim 1, wherein the load circuit includes:
 a resistor coupled between the first voltage source and the output node; and
 a second field effect transistor coupled in parallel to the resistor between both ends of the resistor, and configured to operate in response to the control signal.

9. The feedback-type variable gain amplifier of claim 8, wherein an on-resistance of the second field effect transistor is changed in response to the control signal.

10. The feedback-type variable gain amplifier of claim 8, wherein the second field effect transistor is turned on or turned off in response to the control signal.

11. The feedback-type variable gain amplifier of claim 1, wherein the load circuit includes:
 an inductor coupled between the first voltage source and the output node; and
 a second field effect transistor coupled in parallel to the inductor between both ends of the inductor, and configured to operate in response to the control signal.

12. The feedback-type variable gain amplifier of claim 11, wherein an on-resistance of the second field effect transistor is changed in response to the control signal.

13. The feedback-type variable gain amplifier of claim 11, wherein the second field effect transistor is turned on or turned off in response to the control signal.

14. A feedback-type variable gain amplifier, comprising:
 a first field effect transistor configured to receive a first input voltage signal through a first input node, to amplify the first input voltage signal, and to output the amplified first input voltage signal through a first output node;
 a first feedback circuit coupled between the first input node and the first output node, and configured to generate a first feedback impedance that is changed in response to a first control signal fed thereto;
 a first load circuit coupled between the first output node and a voltage source, and configured to generate a first load impedance that is changed in response to the first control signal to cancel a change of an input impedance of the variable gain amplifier due to a change of the first feedback impedance;
 a second field effect transistor configured to receive a second input voltage signal that is a differential pair with the first input voltage signal through a second input node, configured to amplify the second input voltage signal, and configured to output the amplified second input voltage signal through a second output node;
 a second feedback circuit coupled between the second input node and the second output node, and configured to generate a second feedback impedance that is changed in response to the second control signal fed thereto; and
 a second load circuit coupled between the second output node and the voltage source, and configured to generate a second load impedance that is changed in response to the second control signal to cancel a change of the input impedance of the variable gain amplifier due to a change of the second feedback impedance,
 wherein the first and second toad impedances and the first and second feedback impedances are changed in response to the first and second control signals, respectively.

15. The feedback-type variable gain amplifier of claim 14, wherein the first load impedance is increased when the first feedback impedance is increased, the first load impedance is decreased when the first feedback impedance is decreased, the second load impedance is increased when the second feedback impedance is increased, and the second load impedance is decreased when the second feedback impedance is decreased.

16. The feedback-type variable gain amplifier of claim 14, wherein the first feedback circuit includes:
 a circuit of a capacitor, a resistor, and an inductor that are coupled in series between the first input node and the first output node; and
 a third field effect transistor coupled in parallel to the resistor between both ends of the resistor, and configured to operate in response to the first control signal.

17. The feedback-type variable gain amplifier of claim 14, wherein the first feedback circuit includes:
 a first circuit of a first capacitor, a first resistor, and a first inductor that are coupled in series between the first input node and the first output node; and
 a second circuit of a second capacitor, a second resistor, a third field effect transistor, a third resistor, and a third capacitor that are coupled in series between the first input node and the first output node.

18. The feedback-type variable gain amplifier of claim 14, wherein the first load circuit includes:
 a resistor coupled between the voltage source and the first output node; and
 a third field effect transistor coupled in parallel to the resistor between both ends of the resistor, and configured to operate in response to the first control signal.

19. The feedback-type variable gain amplifier of claim 14, wherein the first load circuit includes:
 an inductor coupled between the voltage source and the first output node; and
 a third field effect transistor coupled in parallel to the inductor between both ends of the inductor, and configured to operate in response to the first control signal.

20. The feedback-type variable gain amplifier of claim 14, wherein the second feedback circuit includes:
 a circuit of a capacitor, a resistor, and an inductor that are coupled in series between the second input node and the second output node; and
 a third field effect transistor coupled in parallel to the resistor between both ends of the resistor, and configured to operate in response to the second control signal.

21. The feedback-type variable gain amplifier of claim 14, wherein the second feedback circuit includes:
 a first circuit of a first capacitor, a first resistor, and a first inductor that are coupled in series between the second input node and the second output node; and
 a second set of a second capacitor, a second resistor, a third field effect transistor, a third resistor, and a third capacitor that are coupled in series between the second input node and the second output node.

22. The feedback-type variable gain amplifier of claim 14, wherein the second load circuit includes:
 a resistor coupled between the voltage source and the second output node; and
 a third field effect transistor coupled in parallel to the resistor between both ends of the resistor, and configured to operate in response to the second control signal.

23. The feedback-type variable gain amplifier of claim 14, wherein the second load circuit includes:
- an inductor coupled between the voltage source and the second output node; and
- a third field effect transistor coupled in parallel to the inductor between both ends of the inductor, and configured to operate in response to the first control signal.

24. A feedback-type variable gain amplifier, comprising:
- a first field effect transistor configured to receive an input voltage signal through an input node, and configured to amplify the input voltage signal;
- a second field effect transistor coupled between a first output terminal of the first field effect transistor and an output node, and configured to have a control terminal for receiving a bias voltage;
- a feedback circuit coupled between the input node and the output node, and configured to generate a feedback impedance that is changed in response to a control signal; and
- a load circuit coupled between the output node and a voltage source, and configured to generate a load impedance that is changed in response to the control signal to cancel a change of an input impedance of the variable gain amplifier due to a change of the feedback impedance,
- wherein the load impedance and the feedback impedance are changed simultaneously in response to the control signal.

25. The feedback-type variable gain amplifier of claim 24, wherein the load impedance is increased when the feedback impedance is increased, and the load impedance is decreased when the feedback impedance is decreased.

26. A feedback-type variable gain amplifier, comprising:
- a first field effect transistor configured to receive a first input voltage signal through a first input node, and to amplify the first input voltage signal;
- a second field effect transistor coupled between a first output terminal of the first field effect transistor and a first output node, and configured to have a control terminal for receiving a first bias voltage;
- a first feedback circuit coupled between the first input node and the first output node, and configured to generate a first feedback impedance that is changed in response to a first control signal fed thereto;
- a first load circuit coupled between the first output node and a voltage source, and configured to generate a first load impedance that is changed in response to the first control signal to cancel a change of an input impedance of the variable gain amplifier due to a change of the first feedback impedance;
- a third field effect transistor configured to receive a second input voltage signal that is a differential pair with the first input voltage signal through a second input node, and to amplify the second input voltage;
- a fourth field effect transistor coupled between a first output terminal of the third field effect transistor and a second output node, and configured to have a control terminal for receiving a second bias voltage;
- a second feedback circuit coupled between the second input node and the second output node, and configured to generate a second feedback impedance that is changed in response to the second control signal fed thereto; and
- a second load circuit coupled between the second output node and the voltage source, and configured to generate a second load impedance that is changed in response to the second control signal to cancel a change of the input impedance of the variable gain amplifier due to a change of the second feedback impedance,
- wherein the first and second load impedances and the first and second feedback impedances are changed in response to the first and second control signals, respectively.

27. The feedback-type variable gain amplifier of claim 26, wherein the first load impedance is increased when the first feedback impedance is increased, the first load impedance is decreased when the first feedback impedance is decreased, the second load impedance is increased when the second feedback impedance is increased, and the second load impedance is decreased when the second feedback impedance is decreased.

* * * * *